(12) United States Patent
Kimino

(10) Patent No.: US 6,946,331 B2
(45) Date of Patent: Sep. 20, 2005

(54) APPARATUS AND METHOD FOR MANUFACTURING SEMICONDUCTOR DEVICE INCORPORATING FUSE ELEMENTS

(75) Inventor: Kazunari Kimino, Hyogo-ken (JP)

(73) Assignee: Ricoh Company, Tokyo (JP)

( * ) Notice: Subject to any disclaimer, the term of this patent is extended or adjusted under 35 U.S.C. 154(b) by 0 days.

(21) Appl. No.: 10/665,481

(22) Filed: Sep. 22, 2003

(65) Prior Publication Data

US 2004/0096591 A1 May 20, 2004

(30) Foreign Application Priority Data

Sep. 19, 2002 (JP) ........................................ 2002-272515

(51) Int. Cl.[7] ........................... H01L 21/82; H01L 21/44
(52) U.S. Cl. ....................................... 438/132; 438/601
(58) Field of Search ................................ 438/132, 601; 257/529

(56) References Cited

U.S. PATENT DOCUMENTS 5,679,967 A * 10/1997 Janai et al. .................. 257/209
5,919,520 A * 7/1999 Tateyama et al. ........... 427/240
2002/0080004 A1 * 6/2002 Kimura et al. .............. 337/158

FOREIGN PATENT DOCUMENTS

JP 2000-150799 5/2000
JP 2000-323576 11/2000

* cited by examiner

*Primary Examiner*—Jennifer M. Kennedy
(74) *Attorney, Agent, or Firm*—Dickstein Shapiro Morin & Oshinsky LLP

(57) ABSTRACT

An apparatus and a method for manufacturing semiconductor devices is disclosed for selectively disconnecting a fuse element out of plural fuse elements formed on a semiconductor wafer substrate which is provided with the plural fuse elements and a dielectric layer having at least one opening corresponding to the location for the plural fuse elements. The method includes processing steps implemented onto the wafer substrate, such as (a) forming a layer of etching barrier resin by scanning at least one discharging nozzle for discharging the raw etching barrier resin while suitably discharging droplets of raw etching barrier resin to replenish the opening corresponding to the location of the fuse element not to be disconnected, (b) hardening the raw etching barrier resin to be a layer of etching barrier resin, and (c) the fuse element in the prescribed disconnecting area without overlying portion of the etching barrier resin layer is selectively disconnected by etching using the dielectric layer and the etching barrier resin as a mask.

3 Claims, 10 Drawing Sheets

APPARATUS AND METHOD FOR MANUFACTURING SEMICONDUCTOR DEVICE INCORPORATING FUSE ELEMENTS

This document claims priority to Japanese Patent Application No. 2002-272515, filed with the Japanese Patent Office on Sep. 19, 2002, the entire contents of which are incorporated by reference herein.

FIELD OF THE INVENTION

Embodiments of the present invention relate generally to an apparatus and a method for manufacturing semiconductor devices and, more specifically, to an improved method for selectively disconnecting fuse elements formed on a semiconductor wafer substrate in semiconductor devices utilizing a dielectric layer having openings and a layer of etching barrier resinous material.

BACKGROUND OF THE INVENTION

With the increased use of resistance hybrids and various circuits incorporating resistance hybrids in the field of integrated analog circuitry, precise resistance adjustment in the resistance hybrid, without undue increase in hybrid circuit area, is of great importance.

One method for adjusting the electronic characteristics in semiconductor circuitry that includes analog circuits, involves the method of laser trimming, which is known in the art. Generally, laser trimming utilizes some of the fuse elements among those formed on a semiconductor wafer substrate and disconnects those elements by irradiating laser beams prior to dicing into chips (as shown in Japanese Laid-Open Patent Application No. 2000-323576). The semiconductor apparatuses are exemplified by incorporating a constant voltage generation circuit and a voltage detection circuit.

As illustrated in FIG. 7, for example, a constant voltage generating circuit 59 is provided to supply a stable power from DC power source 55 to load 57. The constant voltage generating circuit 59 includes an input terminal (Vbat) 61 to which the DC power source 55 is connected, a reference voltage (Vref) generator 63, an operational amplifier 65, a P-channel MOS transistor 67 (hereinafter referred to as "PMOS") to serve as an output driver, and a voltage divider consisting of resistors R1 and R2 and an output terminal (Vout) 69.

The operational amplifier 65 is incorporated into the constant voltage generating circuit 59 such that the output terminal of the amplifier 65 is connected to the gate terminal of PMOS 67, the noninverting terminal is input with the reference voltage Vref from the reference voltage generator 63, and the inverting terminal thereof is input with the output voltage (Vout) divided by the resistors R1 and R2. The constant voltage generating circuit 59 is therefore controlled to bring the voltage divided by the resistors R1 and R2 to be equal to the reference voltage Vref.

FIG. 8 illustrates an exemplary electrical schematic diagram of a voltage detection circuit used in the prior art. An operational amplifier 65 is incorporated into the voltage detection circuit 71 for the inverting terminal of the amplifier 65 to be input with a reference voltage Vref from reference voltage generator 63. The voltage Vsens, which is input to an input terminal 73, is divided by the resistors R1 and R2. The divided voltage is then input to the noninverting terminal of the amplifier 65. In addition, the output of the amplifier 65 is forwarded to exterior by way of an output terminal 75.

The voltage detection circuit 71 is therefore operated such that the output level of the amplifier 65 remains high ("H"), if the voltage Vsens is high enough to bring the voltage, divided by the resistors, R1 and R2, higher than the reference voltage Vref. In contrast, the output level turns low ("L"), if the voltage Vsens decreases so as to bring the voltage, divided by the resistors, lower than the reference voltage. In the constant voltage generating circuit of FIG. 7 and the voltage detection circuit of FIG. 8, a scattering of the reference voltage Vref is encountered, primarily due to scattering of working parameters created during manufacturing process steps.

This scattering is compensated by means of a device, such as a resistance hybrid. The resistance value of the resistance hybrid can be adjusted by disconnecting its component fuse element and thereby serve as a voltage divider having desirable resistance value.

FIG. 9 is a circuit diagram illustrating dividing resistors used in the prior art. The resistance hybrid of FIG. 9 includes an Rbottom resistance element, which is coupled to (m+1) portions of setting resistance elements (RT0, RT1 ... RTm), with m being a positive integer. An Rtop resistance element is connected in series to the setting resistance elements. The setting resistance elements RT0, RT1 ... RTm are coupled in parallel to respective fuse elements RL0, RL1 ... RLm. Such dividing resistors have been disclosed in Japanese Laid-Open Patent Application No. 2000-150799.

Using the above configuration of dividing resistors, the accuracy of the resistance ratio of the setting resistance can be improved. In practice, the accuracy is improved during fabrication by first forming a setting resistance element and a fuse element as a pair, and subsequently arranging a plurality of such pairs in ladder-shaped manner, as shown in FIG. 9. The desirable value of the resistance can be obtained by disconnecting arbitrary fuses which are properly selected among RL0, RL1 ... RLm path by irradiating laser beams.

The dividing resistors of FIG. 9 may be utilized as the voltage divider, consisting of resistors R1 and R2 in the constant voltage generating circuit of FIG. 7, in which an end terminal on the Rbottom side is grounded. Furthermore, an end terminal on the Rtop side is connected to the drain of PMOS 67, and the junction terminal Node L, which is formed between Rbottom and RT0, is connected to the noninverting terminal of operational amplifier 15.

The voltage divider may also be used in the constant voltage generating circuit of FIG. 7, in which the end terminal of the resistance hybrid on the Rbottom side is grounded, the end terminal on the Rtop side is connected to the drain of PMOS 67, and the junction terminal Node M, which is formed between Rbottom and RTm, is connected to the noninverting terminal of operational amplifier 65.

The resistance hybrid of FIG. 9 may also be utilized as the voltage detection circuit illustrated in FIG. 8, in which the end terminal on the Rbottom side is grounded, the end terminal on the Rtop side is connected to a direct current source, and the junction terminal Node L is connected to the noninverting terminal of operational amplifier 65. The voltage divider may also be used in the voltage detection circuit, in which the end terminal on the Rbottom side is grounded, the end terminal on the Rtop side is connected to the direct current source, and the junction terminal Node M is connected to the noninverting terminal of operational amplifier 65.

In the noted laser irradiation method, however, there are encountered several drawbacks in disconnecting fuse elements such as (1) the costliness of laser trimming apparatus and high running costs for implementing the beam irradiation, (2) damage caused by the irradiation onto surrounding portions such as protective layer and substrate and (3) sputtering of fuse element materials and others in the vicinity of opening for the beam irradiation caused by the laser beam.

SUMMARY OF THE INVENTION

Accordingly, an exemplary embodiment of the present invention provides an apparatus and a method for manufacturing semiconductor devices capable of selectively disconnecting a fuse element to be disconnected out of plural fuse elements formed on a semiconductor wafer substrate. The semiconductor wafer substrate is provided with the plural fuse element, and a dielectric layer having openings corresponding to the location for forming plural fuse elements, while reducing manufacturing costs.

In another exemplary embodiment, an apparatus and method for implementing the disconnecting steps of the fuse elements is illustrated for achieving improved reliability of semiconductor devices subjected to these steps.

An exemplary semiconductor manufacturing apparatus disclosed herein includes at least a substrate holding unit for holding a semiconductor wafer substrate, and a discharging mechanism for discharging droplets of raw etching barrier resin through at least one discharging nozzle onto a first surface of the semiconductor wafer substrate held on the substrate holding unit. The semiconductor manufacturing apparatus further includes a drive mechanism for displacing at least one of the semiconductor wafer substrate and discharging nozzle, and a control unit for controlling the discharging mechanism and the drive mechanism such that raw etching barrier resin is attached to the first surface of semiconductor wafer substrate. The semiconductor wafer substrate is provided with at least one fuse element and a dielectric layer having an opening corresponding to the location for forming the at least one fuse element and the control unit controls such that the raw etching barrier resin is discharged into an opening corresponding to the location of a fuse element not to be disconnected out of the at least one fuse element.

As a result of the manufacturing apparatus, etching barrier resin is replenished into an opening corresponding to the location of the fuse element not to be disconnected and subsequently hardened to thereby seal the fuse element with an etching barrier resin layer.

Thereafter, using the etching barrier resin layer as a mask, the semiconductor wafer substrate is subjected to etching process steps, and the fuse element without the corresponding overlying resin layer is etched selectively to thereby achieve the disconnection.

Since the noted etching process can be made without using costly apparatus such as, for example, a laser trimming machine utilizing laser beam irradiation, maintenance costs for the machine is spared, whereby manufacturing costs can be reduced. Furthermore, the precise positioning steps required for fuse disconnection through laser trimming can be minimized.

Less precision is required in positioning the semiconductor since the step of replenishing etching barrier resin into the opening corresponding to the location of the fuse element not to be disconnected presents no particular difficulty for the user, even if a certain amount of spillover arises. The accuracy needed to position the semiconductor manufacturing apparatus will therefore be lower than that needed for laser trimming. As a result, the cost of the apparatus and manufacturing can be reduced, and the time for the positioning can be spared to thereby increase the throughput for the overall process.

An exemplary method is also disclosed for manufacturing a semiconductor device, which selectively disconnects a fuse element out of at least one fuse element formed on a semiconductor wafer substrate. The semiconductor wafer substrate is provided with at least one fuse element and a dielectric layer having at least one opening corresponding to a location for forming the at least one fuse element.

The process includes the step of forming a layer of etching barrier resin in an opening corresponding to the location of a fuse element, and the step of implementing either one of dry and wet etchings using the layer of etching barrier resin as a mask such that the fuse element, without a corresponding overlying layer of etching barrier resin, other than the fuse element to be disconnected is etched.

With the method disclosed herein, the noted etching process can be made without using costly apparatus such as a laser trimming machine, and maintenance costs for the machine, as well as manufacturing costs can be reduced. Further, since laser beam irradiation is not included in the present process, several complications induced by the irradiation are avoided, such as scattering of the particles of wiring and protective layer materials, and/or damage of the fuse elements and substrate, and degradation in quality of semiconductor devices. In addition, since the openings corresponding to fuse elements not to be disconnected are sealed by the etching barrier resin, the reliability can be improved for the semiconductor devices.

Further, prior to a typical laser beam irradiation for disconnecting the fuse elements, the formation of additional protective layers of oxide, having a small thickness, is made to prevent the exposure of fuse element to the exterior and the infiltration of humidity. Since a layer of etching barrier resin is presently used for sealing the opening for the fuse element in the etching method without the formation of the above noted protective oxide layer, the fuse disconnection process can be simplified.

In still another aspect, a semiconductor device disclosed herein includes at least one fuse element formed on the surface of semiconductor wafer substrate and a dielectric layer having at least one opening corresponding to the location for forming the at least one fuse element. A layer of etching barrier resin is formed in an opening in the dielectric layer corresponding to the location of the fuse element not to be disconnected but not in a further opening corresponding to the location of the further fuse element that is to be disconnected.

Since the openings corresponding to fuse elements not to be disconnected are sealed by the etching barrier resin, the infiltration of humidity can be prevented, whereby the reliability can be improved for the semiconductor device. In addition, laser beam irradiation is not included in the present etching method. As a result, several difficulties induced by laser beam irradiation are avoided, such as scattering of the particles of wiring and protective layer materials or the damaging effect on fuse elements and substrate. Accordingly, the reliability can be improved for forming the semiconductor device.

The present disclosure and features and advantages thereof will be more readily apparent from the following detailed description and appended claims when taken with drawings.

DESCRIPTION OF THE PREFERRED EMBODIMENTS

Figure 1A:
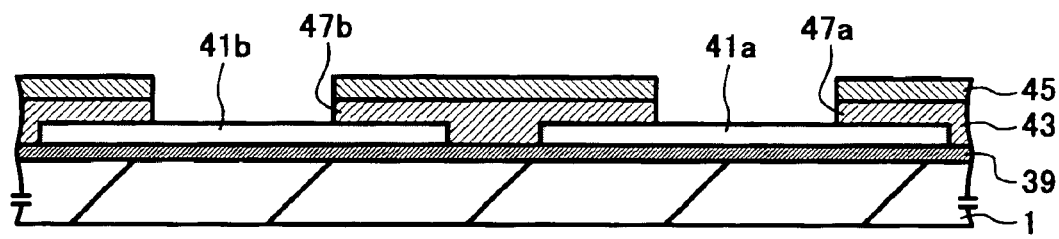
FIGS. 1A through 1D illustrate cross-sectional views for manufacturing semiconductor devices during various stages in the manufacturing process according to embodiments disclosed herein.

In the detailed description which follows, specific embodiments of a semiconductor apparatus and a method for forming the apparatus are described, utilizing a etching barrier resinous layer as a mask which makes not-to-be-disconnected fuse elements in the semiconductor device safe from disconnection. The adjustment of dividing resistors through fuse disconnection can thus be achieved with relative ease and desirable electrical characteristics of the device can be obtained. The apparatus and method of the present disclosure can therefore be adapted to the fabrication of other electronic devices as well. Other embodiments will be apparent to those skilled in the art upon reading the following description.

As described earlier, the semiconductor manufacturing apparatus disclosed herein includes at least a substrate holding unit for holding a semiconductor wafer substrate, a discharging mechanism for discharging droplets of raw etching barrier resin through at least one discharging nozzle onto a first surface of the semiconductor wafer substrate held on the substrate holding unit. A drive mechanism is also included for displacing at least one of the semiconductor wafer substrates and discharging nozzle. A control unit is used for controlling the discharging mechanism and the drive mechanism so that raw etching barrier resin is attached to a first surface of the semiconductor wafer substrate. The semiconductor wafer substrate is provided with at least one fuse element and a dielectric layer having an opening corresponding to the location for forming at least one fuse element.

In the exemplary semiconductor manufacturing apparatus, the discharging mechanism is preferably provided with a plurality of discharging nozzles, thereby contributing to reduce the time for replenishing the noted opening with raw etching barrier resinous material. The substrate holding unit is preferably provided with a substrate temperature control mechanism for controlling the temperature of the semiconductor wafer substrate. Since this temperature control mechanism facilitates to control the viscosity of etching barrier resin replenished into the desirable openings, several improvements can be achieved, such as smoothing the layer surface of raw etching barrier resin, thus increasing the ratio of resin filled into minute portions of the openings and the precision in the thickness of the layer of raw etching barrier resin.

The semiconductor manufacturing apparatus is preferably provided with at least two kinds of discharging mechanisms, each being capable of discharging respective different amounts of raw etching barrier resin. The amounts of resin are controlled by the discharging mechanism such that a first discharging mechanism discharges droplets of resin in an amount that is smaller than other discharging mechanisms into an area in the vicinity of a periphery of the opening.

As a result, the resin amount can be controlled such that the boundary of raw etching barrier layer in the vicinity of an opening can be defined with high enough precision by discharging droplets of smaller amounts. Also the throughput of device fabrication can be improved by discharging the resin droplets of larger amounts into the area other than the noted boundary region.

Furthermore, the discharging mechanism is provided with a resin temperature control mechanism for controlling the temperature of raw etching barrier resin contained in a resin container unit. As a result, the viscosity of etching barrier resin contained in the resin container unit is properly adjusted, and several improvements can be achieved, such as smoothing the surface layer of the raw etching barrier resin, and increasing the ratio of resin filled into minute portions of the openings and the precision in the thickness of the layer of raw etching barrier resin. Also, adjusted viscosity helps to prevent clogging of the nozzle portion with resinous material.

In another aspect, in the method for manufacturing a semiconductor device disclosed herein, the layer of etching barrier resin is formed preferably by scanning at least one discharging nozzle. The discharge nozzles discharge the raw etching barrier resin while suitably discharging droplets of raw etching barrier resin to replenish the opening corresponding to the location of the fuse element not to be disconnected, and subsequently hardening the raw etching barrier resin.

This etching process requires less precision than that required for laser trimming since the step of replenishing etching barrier resin into an opening corresponding to the location of the fuse element not to be disconnected provides a certain level of accuracy, even if a certain amount of spillover is made. The accuracy needed to meet the requirement in positioning for the semiconductor manufacturing apparatus may therefore be lower as compared to laser trimming. As a result, costs of the apparatus and/or manufacturing can be reduced, and further the time for the positioning can be spared to thereby improve the throughput for the overall process.

The choice of material for forming the fuse elements is preferably made from polysilicon under a preferred embodiment. As a result, by utilizing $SF_6$ gaseous atmosphere for the dry etching process, for example, a high selection ratio can be obtained between the polysilicon of fuse elements and other constituents, including the dielectric layer and etching barrier layer.

In another aspect, a semiconductor apparatus is disclosed including a dividing resistor component. The dividing resistor component includes at least two resistors, which are capable of providing an output voltage by dividing an input voltage by the resistive value and of adjusting the output voltage by disconnecting a fuse element. The semiconductor apparatus also includes a dielectric layer having at least one opening corresponding to a location for forming at least one fuse element, and an etching barrier resin layer formed in an opening in the dielectric layer corresponding to the location of the fuse element not to be disconnected out of the at least one fuse element, but not in a further opening corresponding to the location of the further fuse element to be disconnected.

Since the area of opening corresponding to the fuse element not to be disconnected is sealed with etching barrier resinous material, the degradation of fuse elements, which may be caused by, the permeation of moisture, can be obviated. As a result, a high level of precision can be acquired in output voltage obtained by the dividing resistors.

In another aspect, as an alternate embodiment of the semiconductor device disclosed herein, a further semiconductor apparatus is disclosed incorporating a voltage detection circuit. The semiconductor apparatus includes dividing resistors for supplying a divided voltage generated by dividing an input voltage, a reference voltage generator for supplying a reference voltage, and a comparator circuit for comparing the divided voltage with the reference voltage. The dividing resistors comprise a dividing resistor component, including at least two resistors, which are capable of generating an output voltage by dividing an input voltage by the at least two resistors and of adjusting the output voltage by disconnecting a fuse element.

By means of the voltage detection circuit incorporating the dividing resistors, the accuracy in output voltage from the dividing resistors can be stabilized. Therefore, output voltages from the voltage detection circuit can be stabilized.

In another aspect, under still another embodiment of the invention, a semiconductor apparatus is disclosed incorporating a constant voltage generation circuit which includes an output driver for controlling an output of an input voltage, dividing resistors for supplying a divided voltage by dividing an output voltage by the dividing resistors, a reference voltage generator for supplying a reference voltage, and a comparator circuit for comparing the divided voltage with the reference voltage to control an operation of the output driver based on comparison results. The dividing resistors comprise a dividing resistor component, which includes at least two resistors, which are capable of generating an output voltage by dividing an input voltage by the at least two resistors and of adjusting the output voltage by disconnecting a fuse element.

Also, by means of the constant voltage generating circuit incorporating the dividing resistors, the accuracy in output voltage from the dividing resistors can be stabilized. As a result, output voltages from the constant voltage generating circuit can be stabilized.

EXAMPLES

The present invention is described in more detail below by way of the following examples.

FIGS. 1A through 1D are each cross-sectional views illustrating an exemplary method for manufacturing semiconductor devices during various stages in the manufacturing process according to an exemplary embodiment of the invention. FIG. 2 is a schematic diagram illustrating overall construction of an exemplary apparatus for manufacturing the semiconductor devices.

Referring now to FIG. 2, the apparatus will be described according to one embodiment disclosed herein. The apparatus for manufacturing the semiconductor devices includes at least a semiconductor wafer substrate 1 and a substrate holding unit 3. The semiconductor wafer substrate 1 is provided thereon with several fuse elements (not shown) on a first surface 1a on the substrate 1. The substrate holding unit 3 is provided for holding the wafer substrate 1 with its first surface 1a up.

On the upper face of the substrate holding unit 3, small openings are provided (not shown) for use in holding substrate 1, via vacuum, with the first surface 1a up, and the openings, in turn, are each connected to a vacuum unit (not shown) by way of evacuation paths. The substrate holding unit 3 is thereby formed to be capable of properly holding the semiconductor wafer substrate 1.

In addition, the substrate holding unit 3 is further provided with heaters 5 for heating the wafer substrate 1 and a temperature sensor 7 for measuring the temperature of the holding unit 3. The heaters 5 and temperature sensor 7 then constitute a substrate temperature control mechanism in the apparatus for manufacturing the semiconductor devices disclosed herein.

A stage unit 9 is provided for use in positioning the substrate holding unit 3. The stage unit 9 is adapted for either displacing the substrate holding unit 3 in horizontal and/or vertical directions, or rotating in the horizontal plane. The unit 3 therefore constitutes a drive mechanism in the apparatus for manufacturing the semiconductor devices disclosed herein.

A discharging head 11 is positioned above the stage unit 9 and is adapted for discharging raw (uncured) etching barrier resinous materials. An image information camera 31 is provided for acquiring picture images of semiconductor wafer substrate 1. The discharging head 11 constitutes a discharging mechanism in the apparatus for manufacturing the semiconductor devices disclosed herein. Preferably, the position of the discharging head 11 and image information camera 31 are each fixed.

Figure 2:
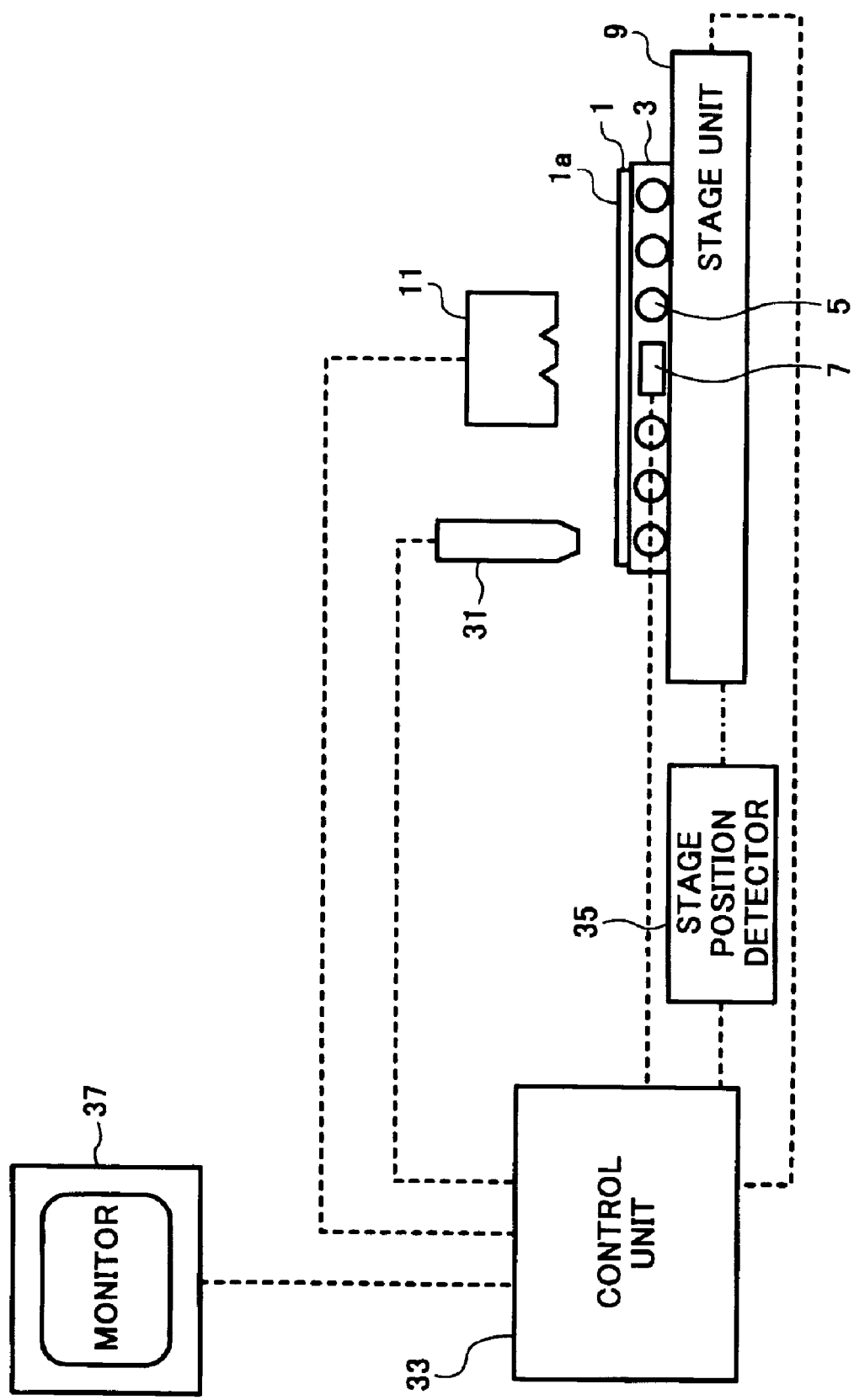
FIG. 2 is a schematic diagram illustrating the overall construction of an exemplary apparatus for manufacturing the semiconductor devices according to an embodiment of the invention.
Figure 3A:
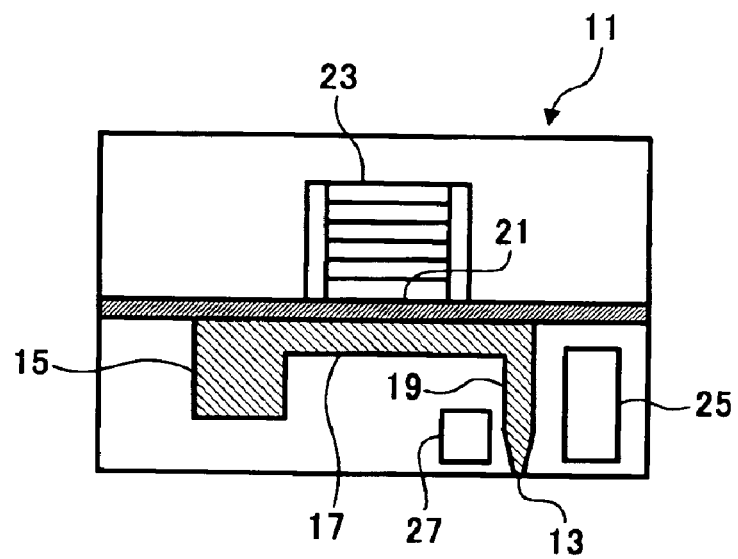
FIGS. 3A and 3B are cross sectional views illustrating the overall construction of the discharging head 11 in its standby and operation periods, respectively.
Figure 3B:
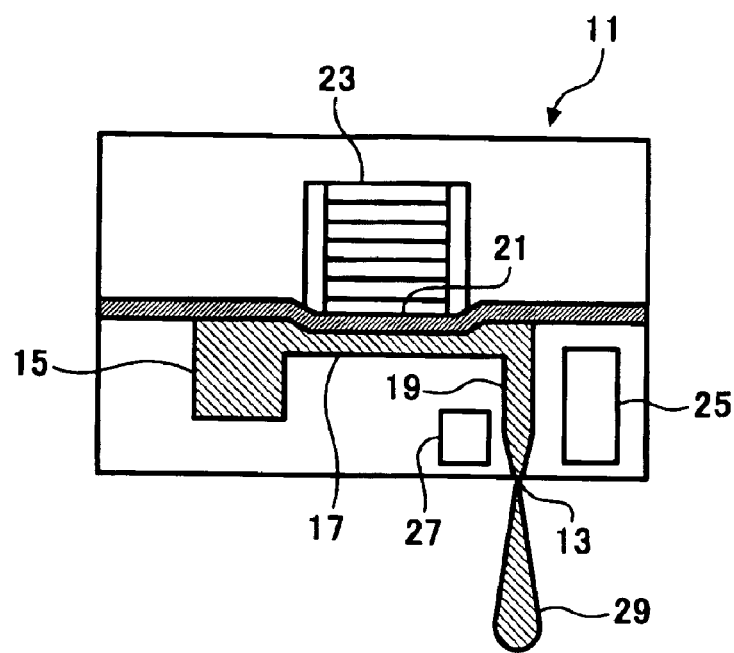

FIGS. 3A and 3B are cross sectional views illustrating the overall construction of the discharging head 11 in standby and discharging periods, respectively. A plurality of discharging nozzles 13 are provided, being aligned either in line or in an array on the face of the discharging head 11 (opposing the semiconductor wafer substrate 1). For purposes of explanation, one discharging nozzle 13 is shown for the discharging head of FIGS. 3A and 3B, and two discharge nozzles are shown for the discharge head of FIG. 2. In addition, a resin container unit 15 is provided for each of the discharging nozzles 13 for containing the raw etching barrier resin.

The resin container unit 15 is connected to the discharging nozzles 13 by way of a fluid feeding path 17 and a discharging vessel 19. A portion of the wall of fluid feeding path 17 is formed of a thin flexible film 21. On one side of the thin flexible film 21 opposite to the fluid feeding path 17, a piezoelectric element 23 is also provided. In addition, the discharging head 11 is provided with a heater 25 for heating, and a temperature sensor 27 for measuring the temperature of the raw etching barrier resin.

The formed discharging head 11 is operated as follows: the discharging head 11 is adapted for discharging liquid droplets 29 of raw sealant resin by exerting pressure generated by the deformation of the piezoelectric element 23. As an example, the piezoelectric element 23 is lengthened by applying a voltage and the fluid feeding path 17 is then pressurized. As a result, a predetermined amount of etching barrier resin is ejected through the discharging nozzles 13 by the pressure presently applied (see FIG. 3B). When the piezoelectric element 23 is restored to the non-pressurized state, another amount of raw etching barrier resin is drawn by suction from the resin container unit 15 into fluid feeding path 17 (see FIG. 3A). The amount of etching barrier resin discharged through the discharging head 11 is adjusted to approximately 0.05 nanoliter, for example. The discharging head 11 therefore, has the structure similar to the piezoelectric type (or piezo-jet type) printer head for use in ink jet printers.

Referring again to FIG. 2, a control unit 33 is additionally provided which is electrically connected to, and adapted for controlling, the stage unit 9 and discharging head 11. A stage position detector 35 is provided in the vicinity of the stage unit 9 for acquiring information on the position of this stage unit 9.

Temperature sensor 7 is electrically connected to the control unit 33, and further to the image information camera 31, and stage position detector 35.

Information such as temperature data from temperature sensors 7 and 27, image information from the image information camera 31, and stage position information from the stage position detector 35, are transmitted to the control unit 33. In addition, a monitor 37 is also electrically connected to the control unit 33 for displaying information for setting the units.

Furthermore, positional information of the not-to-be-disconnected fuse elements is input to the control unit 33 based on the results obtained by a wafer test and other similar measurements of electric characteristics of respective semiconductor devices.

Referring now to FIGS. 1A through 1D and 2, an exemplary method for manufacturing semiconductor devices is described according to one embodiment disclosed herein together with the description on the operation of the manufacturing apparatus. It should be noted that only one of the discharging nozzles 13 is included in the apparatus of FIGS. 1A through 1C, and other portions are herein abbreviated. In addition, the raw etching barrier resin is generally exemplified by thermoplastic or thermosetting plastics combined with other similar materials, thermosetting resin, or a liquid epoxy sealant resin CEL-O3140 (commercially available from Hitachi Chemical Co.) with viscosity of 0.6 Pa's.

A semiconductor wafer substrate 1 is placed on the substrate holding unit 3 having the first surface 1a up. The substrate holding unit 3 then operates to hold with vacuum the semiconductor wafer substrate 1. On a first surface 1a of semiconductor wafer substrate 1, fuse elements 41a and 41b are formed and are each preferably made of polysilicon with an underlying thermal oxide layer 39. Additionally provided on the fuse elements 41a and 41b and thermal oxide layer 39 are a PSG (phosphor silicate glass) oxide 43 and further thereon a nitride layer 45 as a passivation layer.

Furthermore, several openings 47a and 47b are formed in the PSG oxide 43 and nitride layer 45 corresponding to prescribed disconnecting areas of the fuse elements 41a and 41b (FIG. 1A). The fuse elements 41a and 41b are preferably formed having the same structure with one another, in which the element 41a is taken as that to be disconnected in the following process steps, while the element 41b is not to be disconnected.

Figure 4:
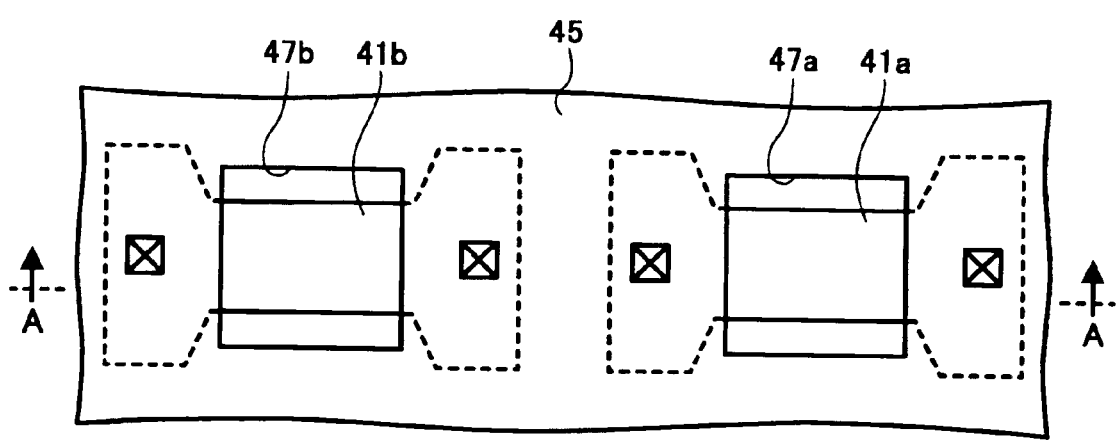
FIG. 4 is a plan view showing a portion of semiconductor wafer substrate 1 of FIG. 1.

FIG. 4 illustrates a portion of semiconductor wafer substrate 1 of FIG. 1.

Referring now to FIGS. 1A through 1D and 4, the semiconductor wafer substrate 1 is detailed herein below. It should be noted that the components, included in the present semiconductor device, other than the fused elements such as circuit elements and wiring materials, are herein abbreviated from the drawing. Sectional views shown in FIGS. 1A through 1D are the drawings each taken along the line A—A of the structure of FIG. 4.

As noted earlier, several layers are formed on the first surface 1a of semiconductor wafer substrate to a thickness of approximately 800 nm for the thermal oxide layer 39, 850 nm PSG oxide 43, 1200 nm nitride layer 45, and 350 nm for polysilicon in use for the fuse elements. In addition, the pattern in the prescribed disconnecting areas of the fuse elements 41a and 41b are designed having a line width ranging from 5 to 8 µm which is smaller than other areas, and the size of the openings 47a and 47b is approximately 20×20 µm².

Regarding the semiconductor wafer substrate 1, surface treating steps to improve the wettability with the raw etching barrier resin may be carried out on the face of the first surface 1a, fuse elements 41a and 41b, and nitride layers 45. Alternatively, the semiconductor wafer substrate 1 may be coated with a thin layer of materials which can yield suitable wettability. Suitable examples of the surface treatment for yielding the wettability include one utilizing active species, which is generated from gaseous ozone or plasma and brought in contact with the surface. The surface treatment, however, may not always be necessary, but be utilized when needed.

The control unit 33 is adapted for controlling the heating by means of the heater 25, and is based on temperature information from the temperature sensor 27 to thereby properly control the temperatures of raw etching barrier resins at the locations in the resin container unit 15, fluid feeding path 17, and discharging vessel 19, in the discharging head 11. In addition, the control unit 33 also controls the heating by the heater 5 based on temperature information from the temperature sensor 7, to thereby properly control the temperature of the surface 1a of wafer substrate 1.

The positioning steps for the semiconductor wafer substrate 1 held on the substrate holding unit 3 are carried out by means of the control unit 33 by properly displacing the stage unit 9 based on image information from image information camera 31. Based on positional information input beforehand from the fuse elements not to be disconnected, and on image information on wafer substrate 1 from image information camera 31 by image recognition techniques, the control unit 33 is then adapted to compute the area on the first surface 1a of the semiconductor wafer substrate 1 onto which etching barrier resin is discharged corresponding to the area of opening for fuse elements not to be disconnected.

Several steps are subsequently described, including the step of sending driving signals to the stage unit 9 and discharging head 11 based on the comparison with the stage position information from stage position detector 35, the step of positioning the substrate holding unit 3 with the suction held semiconductor wafer substrate 1, suitably discharging liquid droplets 29 of raw etching barrier resin from discharging head 11 and filling the area of opening 47b for the fuse element not to be disconnected, whereby a raw etching barrier resin layer 49 is formed on the surface 1a of the wafer substrate 1.

Figure 1B:
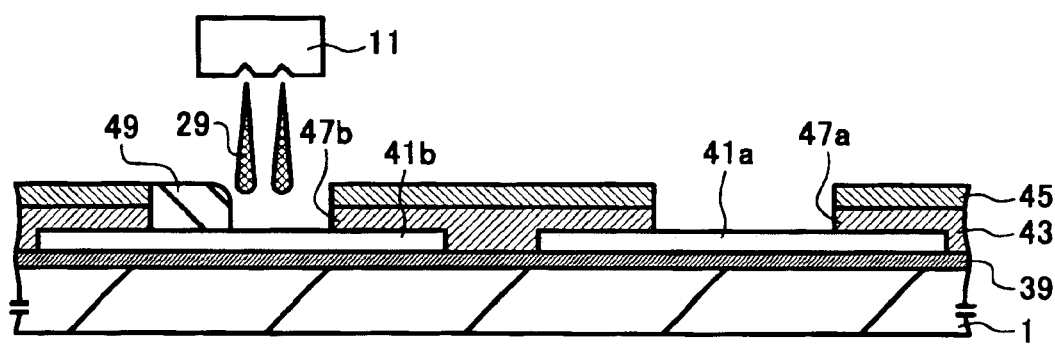
Figure 1C:
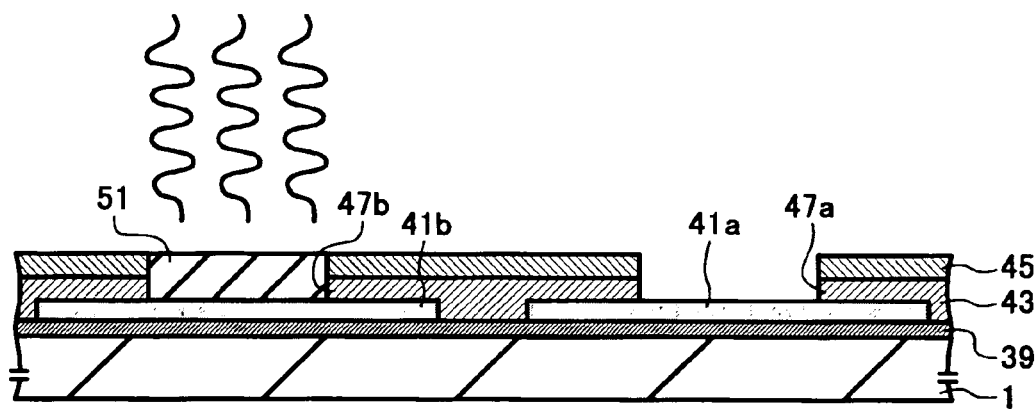

It may be added as an example that the raw etching barrier resin layer 49 is filled into the area of opening 47b in the present embodiment to a thickness of approximately 1650 nm on the thermal oxide layer 39, and approximately 1300 nm on the fuse element 41b, respectively (FIG. 1B). Although the raw etching barrier resin layer 49 is formed in the present embodiment having a thickness approximately the same as the depth of opening 49b, the thickness isn't so critical as long as it does not constitute a hindrance to following etching steps. In addition, the raw etching barrier resin layer 49 may have a thickness so as to protrude toward the region in the vicinity of the opening area.

Since the volume of the droplet of raw etching barrier resin discharged by the discharging head 11 can be controlled as small as 5 nanoliters with precision, the resin amount of the droplets 29 can be controlled to such an extent in precision separation as small as several microns between the noted vicinity areas, if necessary. Following the formation of raw etching barrier resin layer 45 on the area corresponding to the opening 47b for the fuse element not to be disconnected, the wafer substrate 1 is removed from the substrate holding unit 3. The wafer substrate 1 is subsequently subjected to heat treatments, first at temperatures of approximately 120° C. for 30 minutes and then at approximately 150° C. for 120 minutes, for thermosetting the raw etching barrier resin layer 49, whereby a etching barrier resin layer 51 is formed (see FIG. 1C). Following the formation of the raw etching barrier, resin layer 51 in the area near the opening 47b corresponding to the fuse element 41b not to be disconnected, the wafer substrate 1 is subjected to plasma etching process by means of a plasma etching apparatus of the parallel plate type in a $SF_6$ atmosphere with the etching gas being exposed for 120 seconds.

Figure 1D:
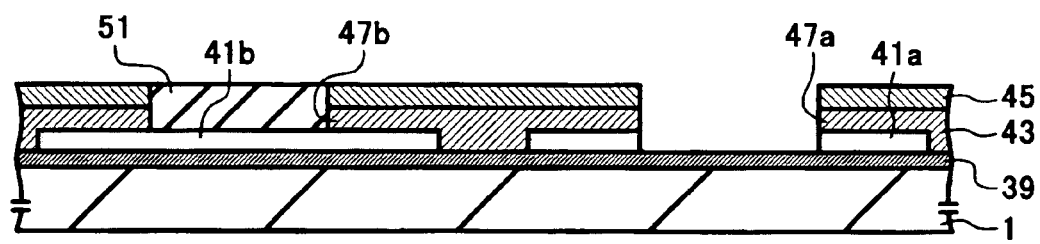

During the process the fuse element 41b not to be disconnected, which is covered by the etching barrier resin layer 51 as a mask, is prevented from the etching, while the fuse element 41a in the prescribed disconnecting area is selectively removed by the etching (FIG. 1D). As a result, the fuse element in the semiconductor device to be disconnected is cut off as desired by the etching, whereby desirable electrical characteristics of the device can be obtained.

Although the steps of disconnecting fuse elements in the present embodiment are thus described utilizing plasma etching process using $SF_6$ gas as the active gas, this is not intended to be limiting. It should be understood that other methods and materials may alternatively be adopted. For example, other methods of etching may alternatively be adopted such as the dry etching methods using other echoing gaseous species and/or other dry or wet etching methods.

Figure 5:
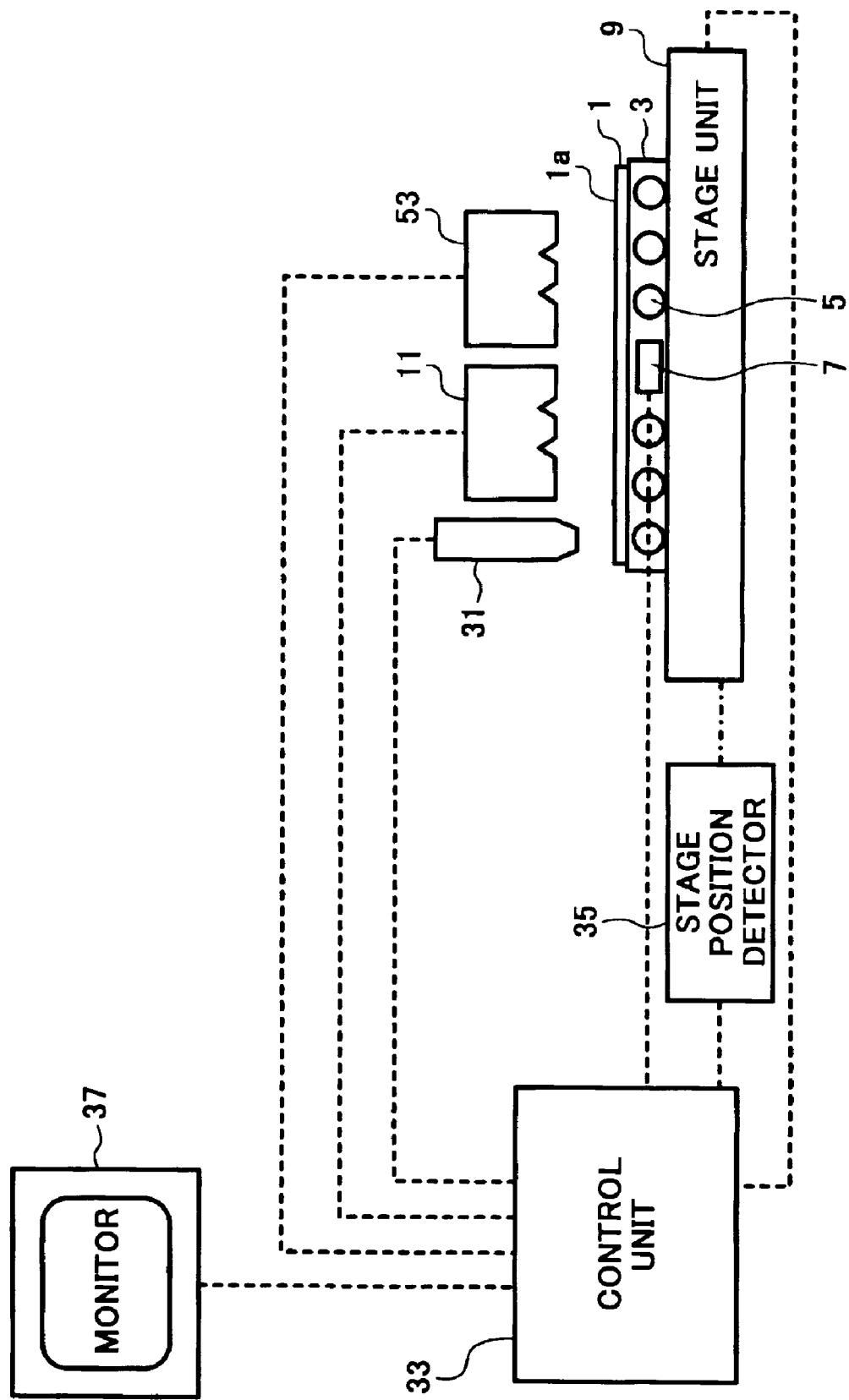
FIG. 5 is a schematic diagram illustrating overall construction of an exemplary apparatus for manufacturing semiconductor devices according to another embodiment disclosed herein.

FIG. 5 is a schematic diagram illustrating an overall construction of the apparatus for manufacturing the semiconductor devices according to another embodiment disclosed herein, in which components similar to those in FIG. 2 are shown with identical numerical representations and detailed description thereof is herein abbreviated.

A discharging head 53 is provided above the stage unit 9 for discharging resinous material of the amount different from the discharging head 11. The position of the discharging head 53 is fixed. In addition, the discharging head 53 is formed having a similar structure to the head 11 and adapted for discharging droplets of etching barrier resin adjusted to approximately 100 nanoliter, for example. The control unit 33 is adapted to control the operation of the discharging head 53 as well.

Figure 6A:
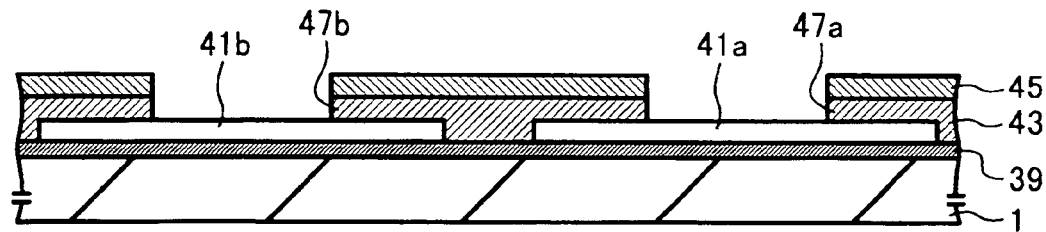
FIGS. 6A through 6E are each cross-sectional views illustrating exemplary methods for manufacturing semiconductor devices during various stages in the process according to another embodiment disclosed herein.
Figure 6B:
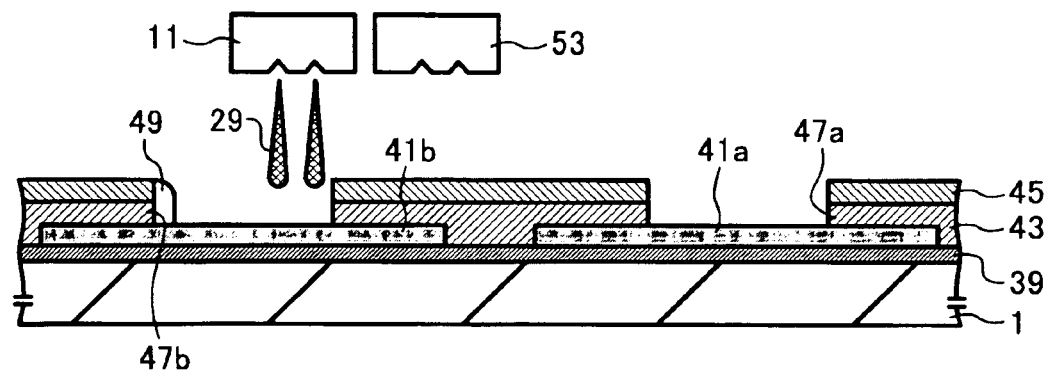
Figure 6C:
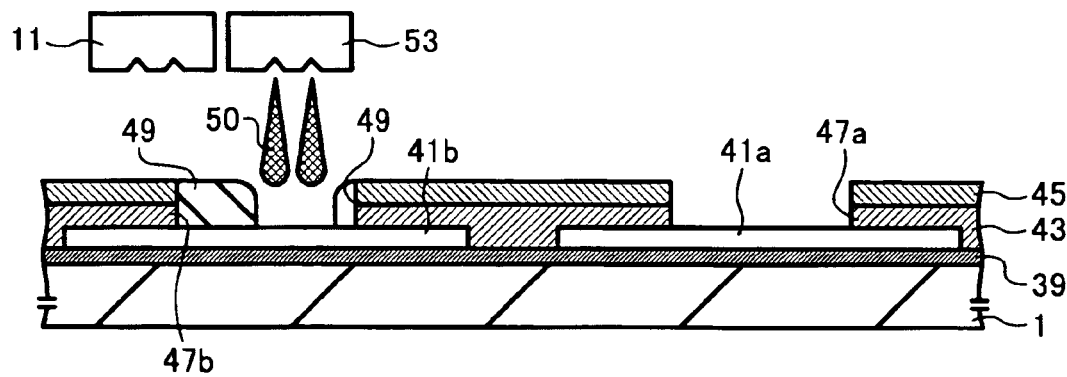

FIGS. 6A through 6E are each cross-sectional views illustrating a method for manufacturing semiconductor devices during various stages in the process according to another embodiment disclosed herein. The apparatus shown in FIG. 4 is utilized also in the present embodiment as the apparatus for manufacturing the semiconductor devices. It should be noted that two discharging nozzles are shown in the apparatus of FIGS. 6A through 6C and other portions are herein abbreviated.

Referring now to FIGS. 5 and 6A through 6D, the method for manufacturing semiconductor devices will be described together with the description on the operation of the manufacturing apparatus.

A semiconductor wafer substrate 1 is provided thereon with fuse elements 41a and 41b having an underlying thermal oxide layer 39, each of which are formed on a first surface 1a of the substrate 1. Further provided on the first surface 1a are PSG oxide layer 43 and nitride layer 45, which are formed having proper openings in the regions corresponding to the fuse elements 41a and 41b to be disconnected during processing. The thus-prepared entire structure of the semiconductor wafer substrate 1 is subsequently placed on a substrate holding unit 3 with the first surface 1a up (see FIG. 6A).

The control unit 33 calculates the area of the surface 1a of semiconductor wafer substrate 1, onto which raw etching barrier resin is discharged. Thereafter, the control unit 33 operates to control the movements of the discharging heads 11 and 53 and the stage unit 9 so as to initiate discharging of the raw etching barrier resin onto the surface 1a of the wafer substrate 1. The area in the vicinity of opening 47b corresponding to the fuse element 41b not to be disconnected during processing (e.g., in the area situated near opening 47b within the distance of approximately 3 μm from the periphery of the opening 47b), a raw etching barrier layer is formed using the discharging head 11 with having smaller amount capability for discharging liquid droplets 29. As a result, the resin amount can be controlled such that the boundary of raw etching barrier layer in the vicinity of opening 47b is defined with satisfactory precision (see FIG. 6B).

In the surface area away from the vicinity of opening 47b(i.e., the central portion of the opening 47b), a further etching barrier resin layer 49 is formed using the discharging head 53 having the capability of discharging larger amount of liquid droplets 50. As a result, the throughput of device fabrication can be improved as compared to the case where the etching barrier resin layer 49 is formed using only the discharging head 11 with a smaller amount capability for discharging liquid droplets (see FIG. 6C).

Figure 6D:
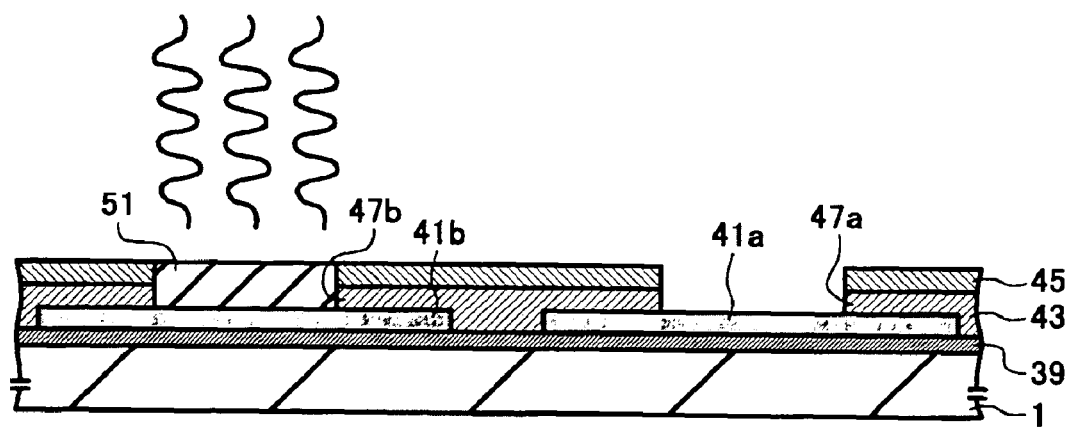

Following the formation of the raw etching barrier resin layer 49 in the area of opening 47b corresponding to the fuse element 41b not to be disconnected, the wafer substrate 1 is removed from the substrate holding unit 3. The wafer substrate 1 is subsequently subjected to heat treatments in a similar manner to the step described above in FIG. 1C, whereby the raw etching barrier resin layer 49 is hardened and an etching barrier resin layer 51 is formed (FIG. 6D).

Figure 6E:
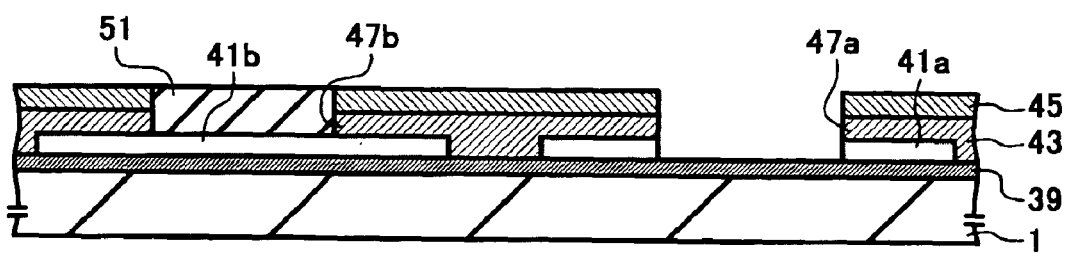

Thereafter, the wafer substrate 1 is subjected to plasma etching process steps in a similar manner to the steps described in reference to FIG. 1D, with the fuse element 41a being disconnected (see FIG. 6E).

According to an exemplary embodiment, by properly choosing, and then using the discharging head to discharge resins of different amounts (depending on the portion within the area into which raw etching barrier resin is discharged), the boundary of raw etching barrier layer in the vicinity of opening 47b can be defined with high precision. Accordingly, the throughput of device fabrication can be improved as compared to the case where the etching barrier resin layer 49 is formed using only the discharging head 11 with a smaller discharging capability.

In the present embodiment disclosed above, the raw etching barrier resin is first discharged using the discharging head 11 in the area located near the opening 47b. The raw etching barrier resin is subsequently replenished into a central portion of the opening 47b by discharging head 53 to form a further etching barrier resin layer 49, whereby the raw etching barrier resin layer 49 is formed over the entire area of the opening 47b. It is understood that the above description is not intended to be limiting. Other methods for forming the resin layer may alternatively be adopted and should be readily apparent to those skilled in the art.

As an example, the raw etching barrier resin layer 49 may be formed through the steps of discharging the raw etching barrier resin, firstly into the central portion, and secondly into the area close the periphery, of the opening 47b. Alternatively, the raw etching barrier resin may be discharged successively into the central portion and then into the area close the periphery, for example, according to the direction the discharging heads travel.

Figure 9:
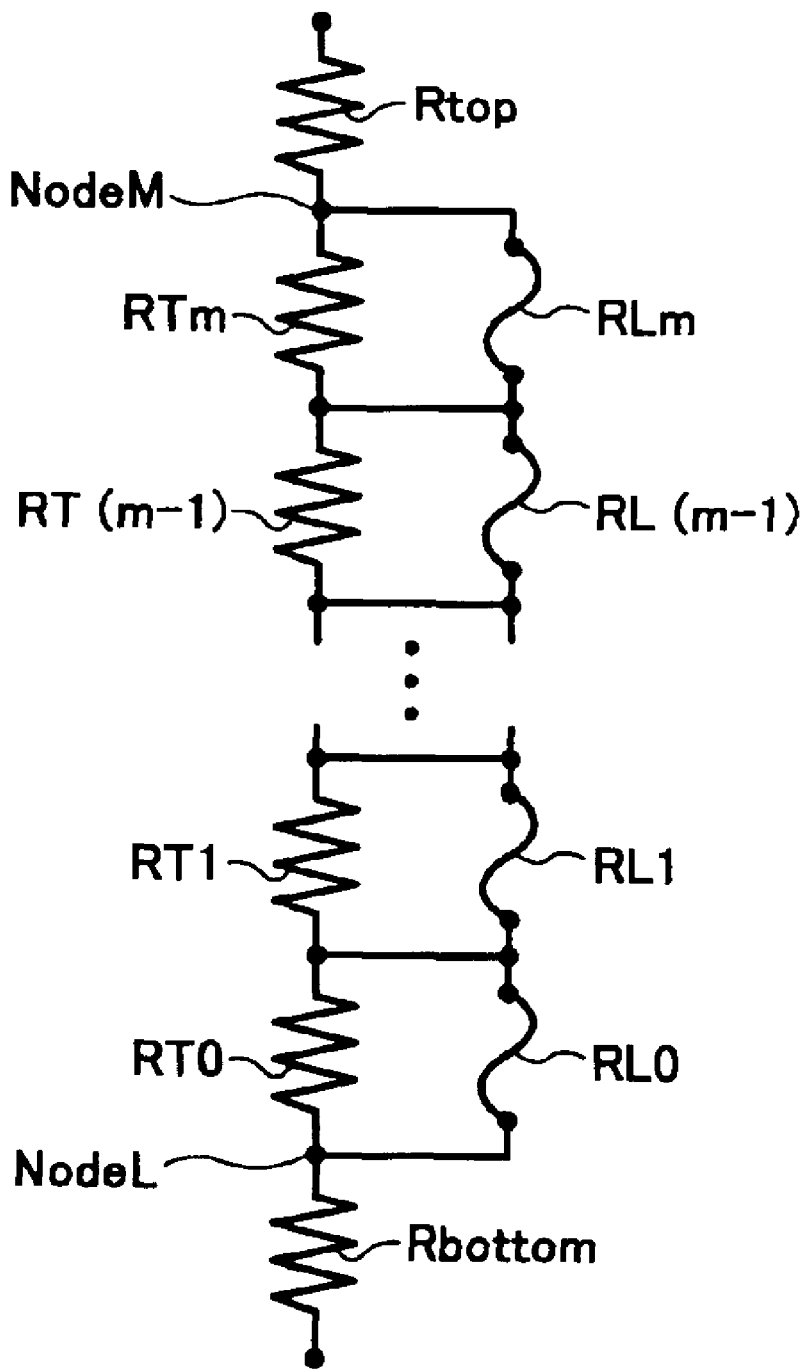
FIG. 9 is a schematic diagram illustrating prior art dividing resistor circuit.

The thus-formed raw etching barrier resin layer 49 near the area of opening 47b corresponds to the fuse element 41b not to be disconnected and will not include any raw etching barrier resin layer in the area of opening 47a corresponding to the fuse element 41a to be disconnected. As a result, the semiconductor apparatus provided with the dividing resistors of FIG. 9, for example, can be attained.

Since the area of opening 47b corresponding to the fuse element 41b not to be disconnected is sealed with etching barrier resinous material, the degradation of fuse elements, which may be caused by the permeation of moisture, can be obviated. As a result, a high degree of precision can be acquired in output voltage obtained by the dividing resistors.

Figure 7:
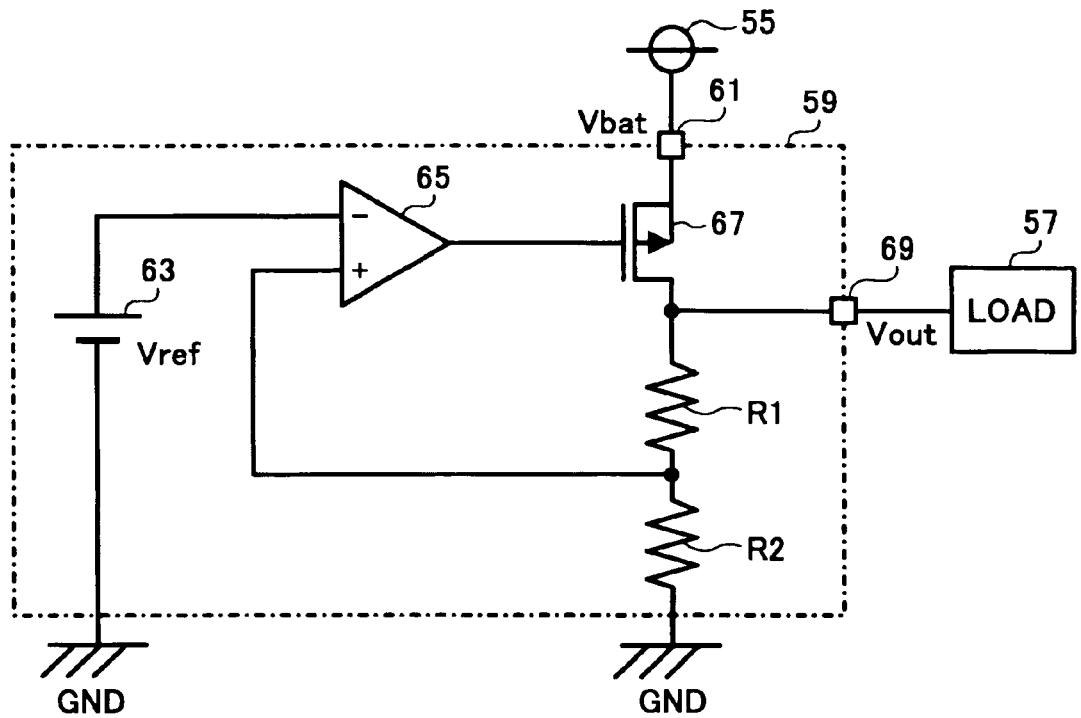
FIG. 7 is an electrical schematic diagram illustrating a prior art constant voltage generating circuit.
Figure 8:
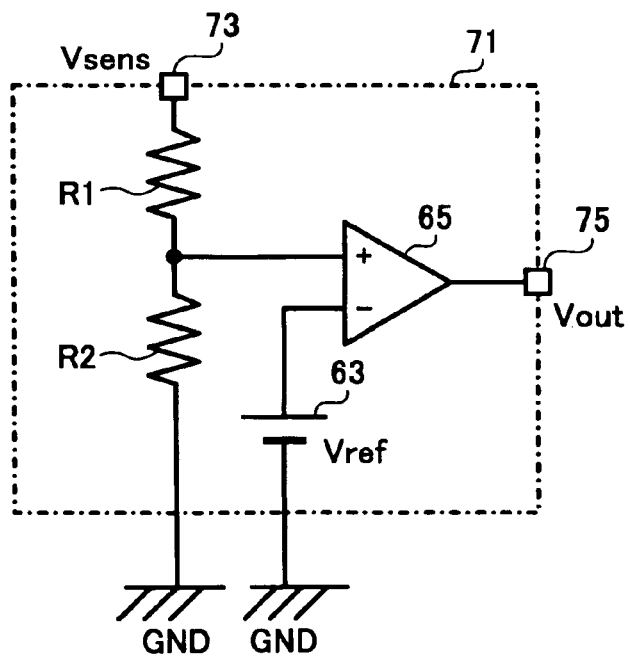
FIG. 8 is an electrical schematic diagram illustrating a prior art voltage detection circuit.

Furthermore, embodiments of the semiconductor apparatus that include the thus formed dividing resistors may be configured with semiconductor apparatuses exemplified by either the constant voltage generating circuit 21 illustrated in FIG. 7 or the voltage detection circuit illustrated of FIG. 8. By means of the constant voltage generating circuit incorporating the dividing resistors, the accuracy in output voltage from the dividing resistors can be stabilized. As a result, output voltages from the constant voltage generating circuit can be stabilized. Also, by means of the voltage detection circuit incorporating the dividing resistors, the accuracy in output voltage from the dividing resistors can be stabilized. Therefore, output voltages from the voltage detection circuit can be stabilized.

While the present disclosure has been described in connection with preferred embodiments, it will be understood that it is not intended to limit the disclosure to these embodiments. For example, although a thermosetting resin is used as the raw etching barrier resin in the present disclosures, other etching barrier resin such as a photo-curing resin or UV (ultra-violet light) curing resin may alternatively be used. In such a case, curing steps suitable for the resin can be adopted, such as light beam irradiation for the photo-curing resin, for example.

And although the temperatures are controlled in the in the resin container unit 15, fluid feeding path 17, discharging vessel 19, and the discharging heads 11 and 49 to thereby properly control the temperature of the surface 1a of wafer substrate 1, the steps disclosed may not be necessary for certain apparatus and method for forming semiconductor devices as long as the resin material presently in use retains suitable viscosity without any temperature control.

In addition, the discharging heads 11 and 53 are provided with fixed positions and are subsequently positioned by properly displacing the substrate holding unit 3 in the embodiments described earlier in reference to FIGS. 2 and 5.

The apparatus in the disclosure may alternatively be provided with other structures, in which either the discharging heads or both discharging heads and substrate holding unit can be displaced.

Still in addition, although a piezoelectric type discharging head (such as the discharging head 11) is preferably used for discharging liquid droplets of raw sealant resin, the apparatus for manufacturing the devices may alternatively be provided with other type discharging heads, such as thermal jet-type heads that utilize vapor pressure generated from liquid through rapid heating, or electromagnetic type heads that operate electromagnetically.

Although the discharging head described earlier has the structure similar to printer head for use in ink jet printers, discharging heads of any other type may alternatively be used as long as the heads are capable of discharging liquid droplets of raw etching barrier resin onto the surface of wafer substrate.

In addition, although the resin container unit 15 is provided for holding the raw etching barrier resin for each discharging nozzle 13, the container unit may alternatively be provided in a common container for plural discharging nozzles. Further, although plural nozzles are formed in one discharging head as noted earlier, the discharging head may alternatively be provided with one nozzle.

Although the semiconductor apparatuses described herein above were exemplified by those including the dividing resistors, constant voltage generating circuit and voltage detection circuit, the present disclosure may also be adapted to other semiconductor apparatuses as long as they incorporate fuse elements formed on the surface of the apparatus and insulation layers provided with openings at the locations corresponding to the fuse elements.

It is apparent from the above description that the apparatus and method disclosed herein have several advantages over similar apparatuses and methods previously known. Although some of the advantages are described earlier in the text, several points are summarized as follows.

The semiconductor manufacturing apparatus disclosed herein is formed to include at least a substrate holding unit for holding a semiconductor wafer substrate, and a discharging mechanism for discharging droplets of raw etching barrier resin through at least one discharging nozzle onto a first surface of the semiconductor wafer substrate held on the substrate holding unit. Further, a drive mechanism is used for displacing at least one of the semiconductor wafer substrates and discharging nozzles, and a control unit is used for controlling the discharging mechanism and the drive mechanism. Under the direction of the control unit, raw etching barrier resin is attached to the first surface of semiconductor wafer substrate, in which the semiconductor wafer substrate is provided with at least one fuse element and a dielectric layer having an opening corresponding to the location for forming the at least one fuse element. The control unit controls such that the raw etching barrier resin is discharged into an opening corresponding to the location of a fuse element not to be disconnected out of the at least one fuse element.

Etching barrier resinous material is then replenished into an opening corresponding to the location of the fuse element not to be disconnected to thereby be able to seal this fuse element with an etching barrier resin layer. Using the thus prepared etching barrier resin layer as a mask, the fuse element is etched selectively to thereby be able to achieve the proper disconnection. Since the noted etching process can be made without using costly apparatus such as, for example, a laser trimming machine utilizing laser beam irradiation, maintenance costs for the machine is reduced.

In addition, since the accuracy needed to meet the requirement in positioning for the present process steps may therefore be lower than that of laser trimming, costs of apparatus and manufacturing can be reduced. Furthermore, the time for the positioning can be spared to thereby increasing the throughput for the overall process.

The discharging mechanism included in the semiconductor manufacturing apparatus is preferably provided with a plurality of discharging nozzles, thereby contributing to the reduction in time needed for replenishing the noted opening with raw etching barrier resinous material.

Also provided are at least two kinds of discharging mechanisms, each being capable of discharging respective different amounts of raw etching barrier resin The discharge amounts are controlled by the discharging mechanism so that a first discharging mechanism discharges droplets of an amount smaller than other discharging mechanisms into an area near a vicinity of a periphery of the opening. As a result, the resin amount can be controlled so that the boundary of raw etching barrier layer near the vicinity of an opening can be defined with higher precision. By discharging droplets of smaller amounts, the throughput of device fabrication can be improved by discharging the resin droplets of larger amount into the area other than the noted boundary region.

In addition, the substrate holding unit is preferably provided with a substrate temperature control mechanism for controlling the temperature of semiconductor wafer substrate. Since this temperature control mechanism facilitates to control the viscosity of etching barrier resin replenished into the desirable openings, several improvements can be achieved such as smoothing the layer surface of raw etching barrier resin, increasing the ratio of filling the resin into minute portions of the openings and the improved precision in the thickness of the layer of raw etching barrier resin.

Furthermore, the discharging mechanism is provided with a resin temperature control mechanism for controlling the temperature of raw etching barrier resin contained in a resin container unit. As a result, the viscosity of etching barrier resin contained in the resin container unit is properly adjusted, thereby smoothing the layer surface of raw etching barrier resin, increasing the ratio of filling the resin into minute portions of the openings and improving the precision in the thickness of the layer of raw etching barrier resin, while preventing the clogging of the nozzle portion with the resinous material.

An exemplary method is used for manufacturing a semiconductor device, that includes the process of selectively disconnecting a fuse element to be disconnected formed on a semiconductor wafer substrate. The method includes the steps of forming a layer of etching barrier resin in an opening corresponding to the location of a fuse element not to be disconnected out of the at least one fuse element, and then implementing an etching process using the layer of etching barrier resin as a mask so that the fuse element to be disconnected is selectively etched.

The etching process can be used without using costly apparatus such as a laser trimming machine utilizing laser beam irradiation, and maintenance costs for the machine is eliminated, and thus reducing the overall manufacturing costs.

Further, since no step of laser beam irradiation is included in the present method, several difficulties can be avoided such as the scattering of particles of wiring and protective layer materials, and damage onto fuse elements and substrate. Accordingly, the degradation in qualities of semiconductor devices can be prevented.

In addition, since the openings corresponding to fuse elements not to be disconnected are sealed by the etching barrier resin, the reliability can be improved for the semiconductor devices.

Still in addition, the formation of a thin protective layer of oxide often made to prevent the exposure of fuse element can be obviated. As a result, the fuse disconnection process can be simplified.

By using the present method, the layer of etching barrier resin is formed by scanning a discharging nozzle for discharging the raw etching barrier resin, while suitably discharging droplets of raw etching barrier resin to replenish the opening corresponding to the location of the fuse element not to be disconnected, and subsequently hardening the raw etching barrier resin. The step needed for replenishing etching barrier resin into the opening corresponding to the location requires less accuracy than the laser trimming. As a result, costs of apparatus and manufacturing can be reduced and the time for the positioning can be spared to thereby improving the throughput for the overall process.

In addition, two kinds of discharging mechanisms are preferably provided for being controlled, such that a first discharging mechanism discharges droplets of an amount smaller than other discharging mechanisms into an area in a vicinity of a periphery of the opening. The boundary of raw etching barrier layer in the vicinity of opening can therefore be defined with high enough precision by discharging droplets of smaller amount, and also the throughput of device fabrication can be improved by discharging the resin droplets of larger amount into the area other than the noted boundary region.

Furthermore, the choice of material used for forming the fuse elements is preferably made from polysilicon. As a result, by utilizing $SF_6$ gaseous atmosphere for the dry etching process, a high selection ratio can be obtained between the polysilicon of fuse elements and other elements, as well as the dielectric layer and etching barrier layer.

As an embodiment of the semiconductor device disclosed herein, a semiconductor apparatus is disclosed including a dividing resistor component including at least two resistors, which are capable of generating an output voltage by dividing an input voltage by the resistive value and adjusting the output voltage by disconnecting a fuse element. The semiconductor apparatus includes a dielectric layer having at lest one opening corresponding to a location for forming at least one fuse element. An etching barrier resin layer is formed near an opening in the dielectric layer which corresponds to the location of a fuse element not to be disconnected out of the at least one fuse element. The layer is preferably not formed in a further opening corresponding to the location of the next fuse element to be disconnected.

Since the area of opening corresponding to the fuse element not to be disconnected is sealed with etching barrier resinous material, the degradation of fuse elements, which may be caused by the permeation of moisture can be obviated, and higher precision can be achieved in output voltage obtained by the dividing resistors.

In addition, as another embodiment of the semiconductor device disclosed herein, a further semiconductor apparatus is disclosed incorporating a voltage detection circuit which includes dividing resistors for supplying a divided voltage generated by dividing an input voltage by the dividing resistive value. A reference voltage generator supplies a reference voltage, and a comparator circuit compares the divided voltage with the reference voltage, in which the dividing resistors comprise a dividing resistor component. The dividing resistor component includes at least two resistors, which are capable of generating an output voltage by dividing an input voltage by the at least two resistors and of adjusting the output voltage by disconnecting a fuse element.

By means of the voltage detection circuit incorporated with the dividing resistors, the accuracy in output voltage from the dividing resistors can be stabilized. Therefore, output voltages from the voltage detection circuit can be stabilized.

Furthermore, as still another embodiment of the semiconductor device disclosed herein, a semiconductor apparatus is disclosed incorporating a constant voltage generation circuit which includes an output driver for controlling an output of an input voltage. Dividing resistors are coupled to the constant voltage generation circuit for supplying a divided voltage by dividing an output voltage by the dividing resistive value A reference voltage generator supplies a reference voltage, and a comparator circuit compares the divided voltage with the reference voltage to control an operation of the output driver based on comparison results. The dividing resistors comprise a dividing resistor component, that includes at least two resistors, which are capable of generating an output voltage by dividing an input voltage by the at least two resistors and of adjusting the output voltage by disconnecting a fuse element.

Also, by means of the constant voltage generating circuit incorporating the dividing resistors, the accuracy in output voltage from the dividing resistors can be stabilized. As a result, output voltages from the constant voltage generating circuit can be stabilized.

The process steps for the formation of sealant resin layers on the surface of wafer substrate may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification also include also a computer-based product which may be hosted on a storage medium, and includes instructions which can be used to program a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

Additional modifications and variations of the present invention are possible in light of the above teachings. It is therefore to be understood that within the scope of the appended claims, the invention may be practiced other than as specifically described herein.

What is claimed as new and desired to be secured by Letters Patent of the United States is:

1. A method for manufacturing a semiconductor device, comprising:

forming a plurality of fuse elements on a semiconductor wafer substrate;

forming at least one dielectric layer over said plurality of fuse elements with a plurality of openings over respective fuse elements;

forming a layer of etching barrier resin in an opening corresponding to a location of at least one fuse element not to be selectively disconnected, wherein said step of forming said layer of etching barrier resin further comprises discharging droplets of a raw etching barrier resin material of an amount smaller for an area in vicinity of a periphery, than other portions, of said opening; and implementing dry and/or wet etching steps using said layer of etching barrier resin as a mask such that said at least one fuse element not to be selectively disconnected is not etched, and wherein said at least one fuse element selected to be disconnected is at least partially etched.

2. The method for manufacturing a semiconductor device according to claim 1, wherein said plurality of fuse elements is formed of polysilicon.

3. A method for manufacturing a semiconductor device, comprising:

forming a plurality of fuse elements on a semiconductor wafer substrate;

forming at least one dielectric layer over said plurality of fuse elements with a plurality of openings over respective fuse elements;

forming a layer of etching barrier resin in an opening corresponding to a location of at least one fuse element not to be selectively disconnected out of said plurality of fuse elements, wherein said step of forming said layer of etching barrier resin further comprises scanning at least one discharging nozzle for discharging raw etching barrier resin while discharging droplets of said raw etching barrier resin so as to replenish said opening corresponding to said location of said fuse element not selectively disconnected, and hardening said raw etching barrier resin, and wherein said step of discharging droplets further comprises discharging droplets of said raw etching barrier resin of an amount smaller for an area in vicinity of a periphery, than other portions, of said opening; and implementing either one of dry and wet etching steps using said layer of etching barrier resin as a mask such that at least one fuse element not to be selectively disconnected is not etched, and wherein said at least one fuse element selected to be disconnected is at least partially etched.

* * * * *